US006213866B1

United States Patent
Impellizzeri

(10) Patent No.: US 6,213,866 B1
(45) Date of Patent: Apr. 10, 2001

(54) VENTILATING BASE

(76) Inventor: John S. Impellizzeri, P.O. Box 354, Newfoundland, PA (US) 18445

( * ) Notice: Subject to any disclaimer, the term of this patent is extended or adjusted under 35 U.S.C. 154(b) by 0 days.

(21) Appl. No.: 09/489,645

(22) Filed: Jan. 24, 2000

Related U.S. Application Data

(60) Provisional application No. 60/117,436, filed on Jan. 26, 1999.

(51) Int. Cl.$^7$ ........................................... H05K 7/20
(52) U.S. Cl. ..................... 454/184; 165/80.2; 361/687; 361/695
(58) Field of Search ........................... 454/184; 361/687, 361/695; 165/80.2

(56) References Cited

U.S. PATENT DOCUMENTS

| 2,485,880 | 10/1949 | Hawkins | 219/19 |
|---|---|---|---|
| 4,662,830 | 5/1987 | Pottebaum | 417/424 |
| 4,753,496 | 6/1988 | Bussard | 312/236 |
| 5,101,321 | 3/1992 | Remise et al. | 361/384 |
| 5,787,057 | 7/1998 | Fan | 369/34 |
| 5,793,609 | 8/1998 | Donahoe et al. | 361/695 |
| 5,793,740 | 8/1998 | Nguyen | 369/264 |

FOREIGN PATENT DOCUMENTS

| 62-124330 | 6/1987 | (JP) . |
| 63-16197 | 1/1988 | (JP) . |

Primary Examiner—Harold Joyce
(74) Attorney, Agent, or Firm—Jonathan A. Bay

(57) ABSTRACT

A ventilating base for combined use with a given electronic device has a frame construction including an apertured top wall. An air fan mounted to the frame and functionally connected with the apertured top wall is operative to produce one of air suction, air blowing, or either at alternate times. The given electronic device is set or docked upon the ventilating base such that a ventilated bottom panel of the electronic device is functionally coupled with the apertured top wall of the ventilating base. That way, operation of the ventilating base's fan induces a forced air current through the electronic device's enclosure and thus provides an augmenting forced air cooling current through the electronic device for improved removal of waste heat therein.

9 Claims, 5 Drawing Sheets

US 6,213,866 B1

VENTILATING BASE

CROSS-REFERENCE TO PROVISIONAL APPLICATION(S)

This application claims the benefit of U.S. Provisional Application No. 60/117,436, filed Jan. 26, 1999.

BACKGROUND AND SUMMARY OF THE INVENTION

The invention generally relates to a base or stand for elevating a given electronic apparatus and not only that but, more particularly, to a ventilating base which operatively couples with the given electronic apparatus so as to service or augment service of waste-heat removal within the electronic apparatus by means of air moving equipment built-in to the ventilating base.

In an alternative use of the invention, it is set on the ventilation vents on the sloping backside of a television cabinet, above the picture tube, and while there suctions a current of air through the television's cooling vents by virtue of being set on top there.

A number of additional features and objects will be apparent in connection with the following discussion of preferred embodiments and examples.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings.

DETAILED DESCRIPTION OF THE PREFERRED EMBODIMENTS

Figure 1:
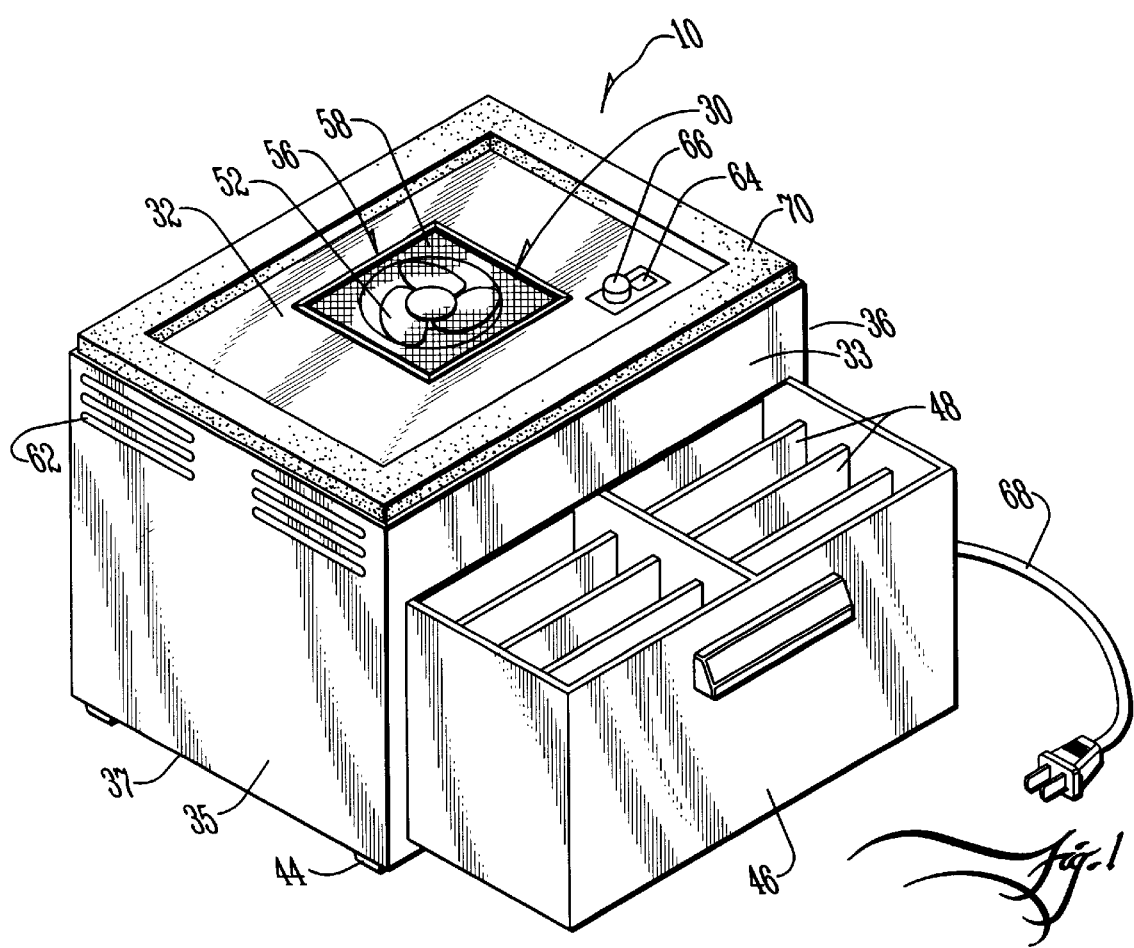
FIG. 1 is a perspective view of a ventilating base in accordance with the invention.
Figure 2:
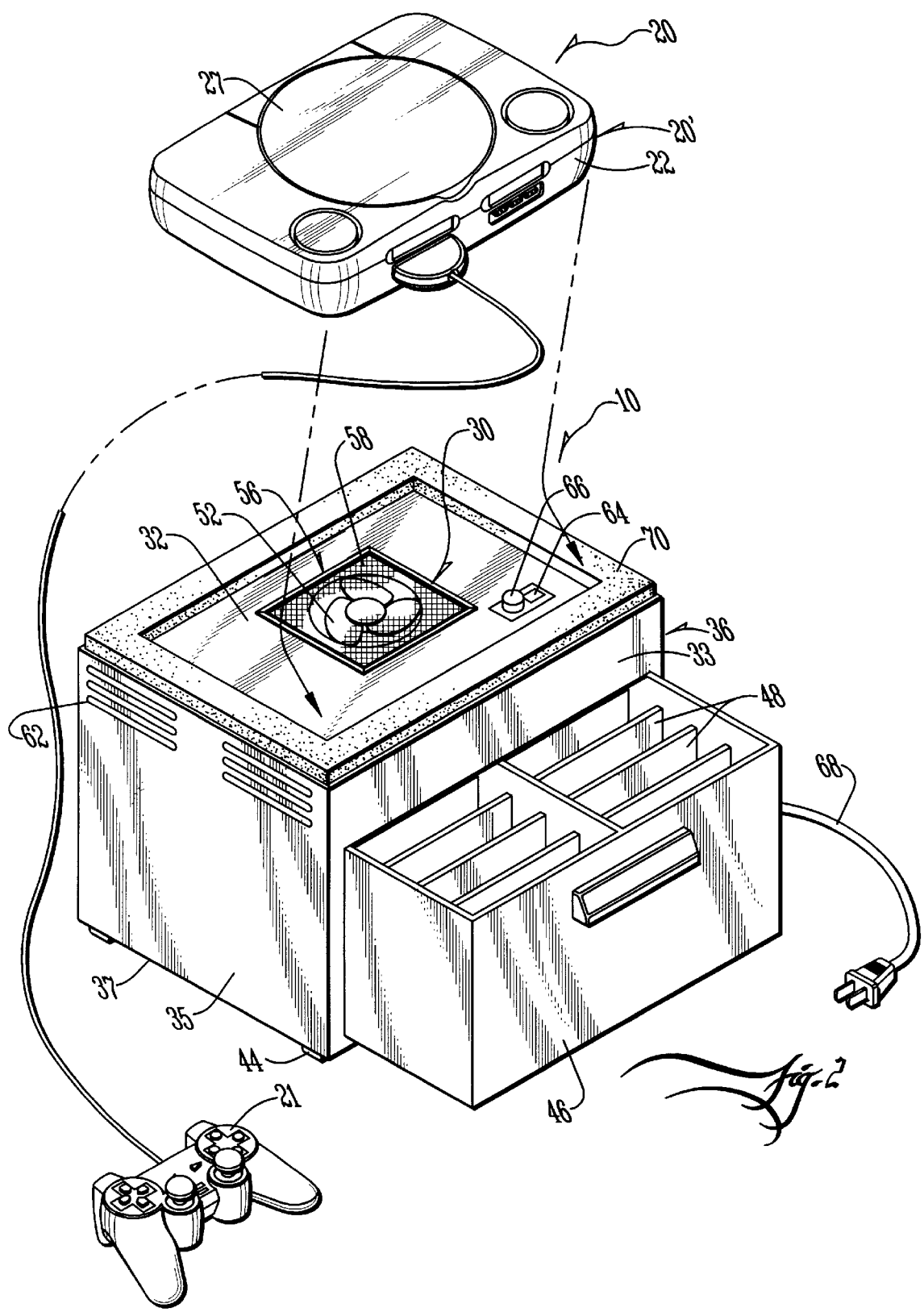
FIG. 2 is a reduced scale perspective view thereof, except including an example unit of an electronic apparatus to show various operative uses of the ventilating base, including that it not only elevates a given electronic apparatus up off a given reference elevation but also operatively couples to the given electronic apparatus so as to service or augment service of waste-heat removal within the electronic apparatus, wherein direction arrows show how the electronic unit preferably sets down on the ventilating base.
Figure 3:
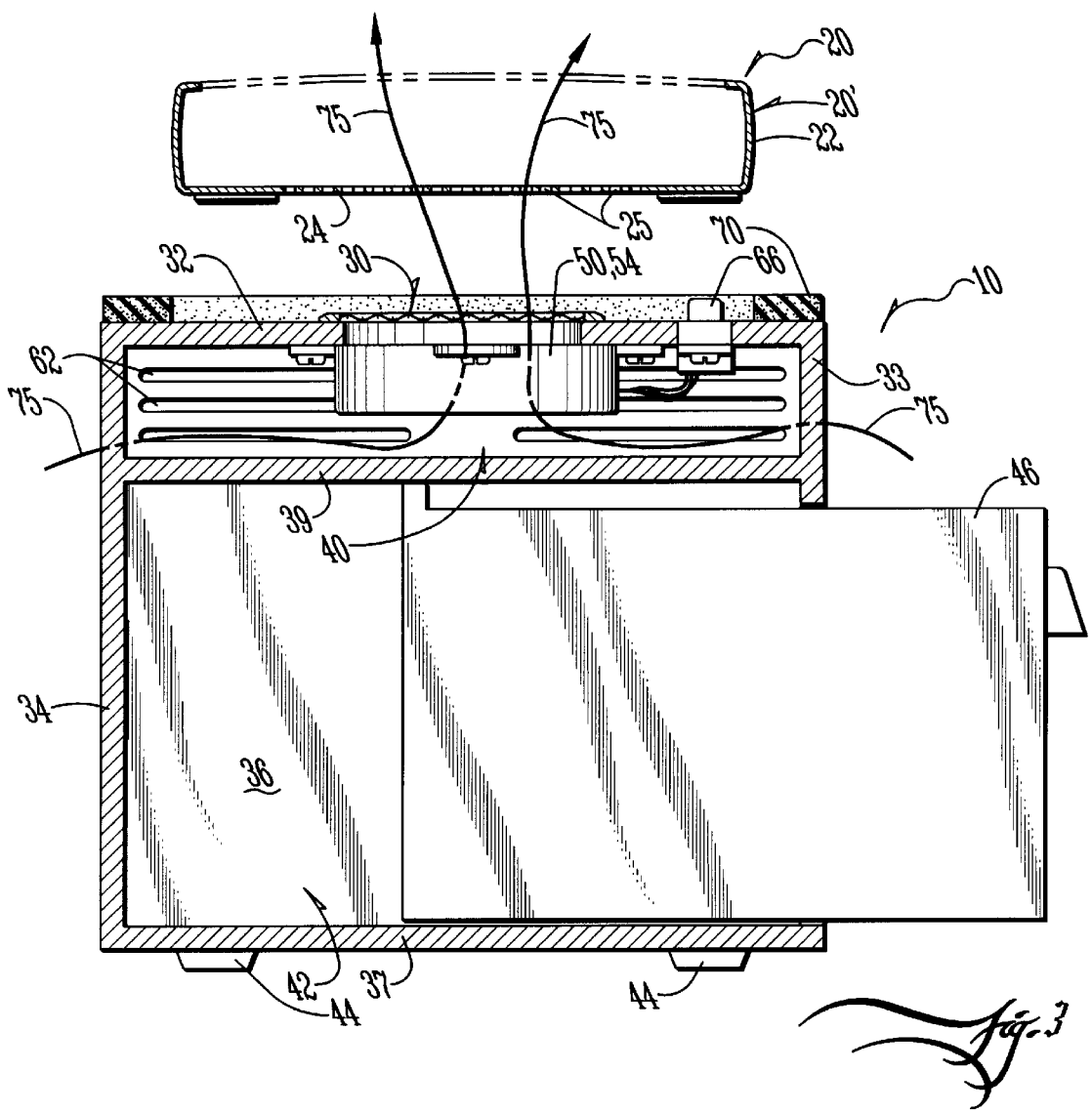
FIG. 3 is a side partial section view of FIG. 2 in general, as taken through a vertical plane of symmetry, wherein direction arrows show one example of air circulation as induced by air moving equipment built-in to the ventilating base.

FIGS. 1 through 3 show a base stand or "ventilating base" 10 in accordance with the invention. The ventilating base 10 provides multiple services. It not only elevates a given electronic apparatus 20 up off a given reference elevation, but it also operatively couples with the given electronic apparatus 20 so as to service or augment service of waste-heat removal within the electronic apparatus 20. The ventilating base 10 does this by means of air moving equipment 30 built-in to it.

In the drawings, the example electronic unit 20 is more particularly shown as a SONY® Play-Station™ control unit 20'. The SONY® Play-Station™ is a popular in-home video game system that connects by cable directly to the television (no television is shown). However, the ventilating base 10 can be produced in configurations suitable for use with various other electronic apparatus besides the SONY® Play-Station™ as shown, and accordingly, the depiction and description of the SONY® Play-Station™ is used merely for convenience in this specification for sake of an example, and its inclusion as an example here does not limit the invention exclusively to use with the SONY® Play-Station™.

The example of the SONY® Play-Station™ does allow, however, a brief description of the problems with a representative class of electronic apparatus that are addressed by the invention. The marketplace has virtually exploded with a bewildering variety of electronic devices which fill the home and workplace. These include without limitation entertainment devices such as games, VCR's, stereo equipment and all the peripherals including CR-ROM units and tape decks, satellite signal processors and so on. A game system such as the SONY® Play-Station™ is brought into the home. The main control unit 20' of the system may have several resting places during a week. At times when put away the main control unit 20' may have a place in a cabinet or on a shelf in the home where it is out of the way. When pulled out for use the main control unit 20' might be set about anywhere, like on a coffee table or even on the floor. An informal survey finds that users of the SONY® Play-Station™ quite commonly set it on the floor from time to time, and when they do so, as during use, as generally square in front of the television. That way, the users have a clear view of the television with the main control unit 20' close at hand to change between games. The users play the games by of course skilled manipulation of the handheld interface devices (eg., one shown in FIG. 2 and indicated as 21).

As inherent to most electronic apparatus, the SONY® Play-Station™ main control unit 20' produces waste heat. Presumptively the SONY® Play-Station™ 20 has built-in means for handling or dissipating the waste heat. Inspection of an actual SONY® Play-Station™ main control unit finds that it has a relatively flat plastic box-like housing (eg., 22). The housing 22 includes a bottom wall 24 which has ventilation openings (indicated as 25 in FIGS. 3 and 4). Such ventilation openings 25 are consistent with waste heat removal because they allow the movement of circulation air in or out of the unit 20'.

While indeed the housing 22 has a ventilated bottom wall 24, the housing 22 has no corresponding ventilation openings in the top or side walls thereof. However, the SONY® Play-Station™ has a CD-ROM drive naturally enough, for playing the CD-encoded games. The top wall includes a dust cover lid 27 for covering over the CD-ROM drive. The lid 27 flips open on rear hinges to allow access to the CD-ROM drive and swapping out the game CD's. The thing about this lid 27 is that, when it closes shut it is still sufficiently leaky so as to allow the movement of circulation air in and out of the housing 22 much as the ventilation openings 25 in the bottom 24.

Further inspection of the SONY® Play-Station™ main control unit 20' failed to definitively prove how waste heat is handled inside. By inspecting as by listening carefully, no apparent sound was discernible which could be attributed to a blower fan. That function may indeed be handled by the CD-ROM drive because it is known in the art to unite in a single drive system both a CD-ROM drive and an impeller or sorts, as shown for example by U.S. Pat. No. 5,793,740—Nguyen or U.S. Pat. No. 4,662,830—Pottebaum. Whether or not the SONY® Play-Station™ incorporates such impellers as driven off the CD-ROM drive, casual inspection tends to suggest that there indeed is some weak motivator of circulation air.

Casual inspection also suggests that a major way which waste heat is dissipated is through natural convection. In use a plume of waste heat seems to rise off the SONY® Station™, and evidently the feed air for much of that plume enters the housing 22 through the ventilation openings 25 in the bottom 24.

And so to return to the matter of the control unit 20' and the floor, in many homes the floor is carpeted. Carpeting blocks or plugs those ventilation openings 25 in the bottom wall 24. Thus carpeting stifles the infeed of circulation air in through the ventilated bottom 24. Needless to say this detracts substantially from the waste-heat removal ability of the SONY® Play-Station™.

In fact, arguably, carpeting can block the intake of fresh air in through the ventilated bottom 24 (or else its movement out) sufficiently such that the control unit 20' moderately overheats.

The problems that result from moderate overheating are numerous. The game speed may slow, and to the great consternation of the players. The temperature differential between ON-and-hot against OFF-and-cold becomes greater. Thus repetitive cycles of ON and OFF likely shortens the lifetime of the control unit 20'. That is, it likely reduces the number of times it can survive cycles of ON/hot and OFF/cold before something fails. Simply put, the build-up of waste heat inside the control unit 20' is problem which deserves attention.

Players perhaps could be more careful about not setting the control unit 20' on carpeting. However the players are often children and the persons who suffer the financial consequences of failed units 20' are just as often the adults. What is needed is an improvement, one of the main objects of which is to overcome any of the aforementioned problems. These and other objects and inventive aspects are accomplished by the ventilating base 10 in accordance with the invention.

The ventilating base 10 provides a cabinet-like structure. It has a top panel 32 that plainly allows elevating the control unit 20' up off, say, the floor, or any like given reference elevation.

The cabinet-like configuration of the ventilating base 10 is given in the drawings here merely for convenience of one example embodiment of the invention, as it can be rendered by routine skill in various other ways as would be apparent to one having ordinary skill in the art. As shown, the cabinet structure 10 has six outer panels 32–37 comprising four side panels 33–36 and a top and bottom 21 and 37. An interior partition 39 divides the interior space into an upper and lower compartment 40 and 42. The upper compartment 40 provides for the installation of the air motivating equipment 30 in accordance with the invention.

The lower compartment 42 is utilized in an inventive way merely to take advantage of its existence. In the drawings, it is shown as a storage bay as, more particularly for example, a drawer space for drawer 46. It could alternatively include racks or dividers for organizing CD's as well. Thus, the top panel 32 preferably measures a given distance above the feet 44 of the base 10 just so that it props the given electronic apparatus 20 at the given elevation above the floor (eg., or given reference elevation). One compartment or another 40 or 42 is relied on to house the air motivating equipment 32, and that has been decided in favor of a compartment 40 lying immediately underneath the top panel 32. Alternatively, this compartment for the fan or blower system 30 could just as easily be set to one side of the top panel 32, and not just underneath. However, there being space available between the top panel 32 and the feet 44, this space has been utilized in the format of a fan blower compartment 40. Moreover, given the abundance of space, it has further been utilized in the format as a drawer compartment 42. A drawer 46 is provided to slide in and out of the drawer compartment 42 through a suitable opening in the front panel 33.

In general the drawer 46 provides users with a convenient storage place for any accessories (eg., 21) to the given electronic apparatus 20. In more concrete terms, since the example electronic apparatus 20 shown by the drawings is the SONY® Play-Station™, its major accessories include the handheld interface devices 21 and the CD game cartridges (not shown). The drawer 46 has been partitioned with a series of dividers 48 for convenience of organizing and filing away such game CD's as well as interface devices of about the same small size (eg., 21; however, joysticks—not shown—are likely not to fit in such slots unless an enlarged space is provided for them). But configuring the lower compartment 42 as a drawer space is merely shown as a non-limiting example of how to advantageously employ the available space for the purposes of the SONY® Play-Station™.

To turn attention now to the upper compartment 40, it houses the air motivating equipment 30 in accordance with the invention. The air motivating equipment 30 comprises a fan unit 50 having a blade structure 52, a motor (hidden from view) for turning the blades 52, and a shroud 54 for surrounding the blades 52 and motor. The base 10's top panel 32 is formed with a square port 56. The fan 50 is mounted to that periphery of that port 56 by the shroud 54. The shroud 54 has four corner tabs extending out from its cylindrical body to fill up the corner gaps in the square port 56 and so limit leakage around the blades 52. The port 56 also has a grill 58 to cover the fan blades 52.

In the upper compartment 40, the left and right side panels 35 and 37 are provided with sets of ventilation slots 62. These slots 62 permit movement of circulation air in or out of the upper compartment 40. The back or front panels 34 or 33 may likewise be formed with such slots but this is not shown by the drawings. The top panel 32 includes next to the port 56 a set of controls 64,66. These controls 64,66 preferably control the following operative functions of the fan 50:—eg., to change its ON or OFF state, to change or reverse its direction of turning, and to change its speed. Changing its direction of turning allows changing whether the fan 50 blows or suctions air through the SONY® Play-Station™. The speed control 66 is preferably variable speed but it may alternatively be configured for discrete speeds such as HI and LO. A line cord 68 is included for plugging into a conventional socket of public-utility supplied electric power (not shown). The top panel 32 has a rectangular-frame foam gasket 70 affixed to it and extending around covering an inside margin of the top panel 32's four (4) rectangle edges.

The foam gasket 70 provides several benefits. It increases the frictional gripping between the base 10 and the SONY® Play-Station™ 20 and hence enhances the stability of the SONY® Play-Station™ 20 on the base 10. The gasket 70 forms a light air seal and hence eliminates leakage of air moving between the ventilating base 10 and the SONY® Play-Station™ 20. In fact, in use, preferably the ventilated base 10 is operated such that it suctions air through the SONY® Play-Station™ 20. The suction of air through the SONY® Play-Station™ 20 is likely to increase the compression of the SONY® Play-Station™ 20 on the gasket 70. In contrast, blowing air through the SONY® Play-Station™ 20 is likely to lighten the contact between the gasket 70 and SONY® Play-Station™ 20. Accordingly, with no other good reasons why not, preferably the ventilated base 10 is operated to suction air through the SONY® Play-Station™ 20. Even though for the SONY® Play-Station™ 20 the built-in movement of air is probably up, preferably the ventilating base 10 is operated in opposition to the built-in movement of air. The fan power of the ventilating base 10 is sufficient to overcome the built-in circulation scheme of the SONY® Play-Station™ 20. Regardless, the built-in circulation scheme for the SONY® Play-Station™ 20 seems to measure weak. Hence it is not thought to be problematical to run it in reverse.

However, the ventilating base 10 specifically includes a reverse control 64 for those users or owners who prefer to run the air circulation in the direction as they see best. The speed control 66 gives the users or owners further control over the waste-heat removal dynamics within the given electronic apparatus. In the case of the SONY® Play-Station™ 20, the OEM s literature on it is silent on the issue of augmenting its waste heat removal capability. Accordingly, based on such lack of information, a user who may nevertheless wish to augment the waste heat removal may also do it conservatively as by running a low speed air current through the given apparatus 20. In contrast, other users may be of the view that OEM's provide as minimal built-in waste heat removal as necessary to insure only that their products will survive the warranty. Those owners needless to say might be the same ones who wish to extend the lives of their electronic apparatus 20 as much as possible. Those owners more than likely would run the ventilating base 10 at higher speed(s).

FIG. 3 shows a representative scheme of air movement through the ventilating base 10 and SONY® Play-Station™ 20 as indicated by arrows 75. These arrows 75 are typical of a suctioning scheme. A blowing scheme would appear fairly similar except in having the arrows 75 point in the opposite directions. It is noted that the SONY® Play-Station™ 20 is shown merely diagrammatically for convenience in FIG. 3.

The ventilating base 10 has feet pads 44 sticking down from the corner areas of the bottom panel 37. The feet pads 4 are preferably synthetic rubber or the like to prevent slippage and accommodate moderate surface roughness or unevenness and so on whatever surface the ventilating base 10 is rested on. As previously discussed, such a surface includes carpeted floor and the like.

Figure 4:
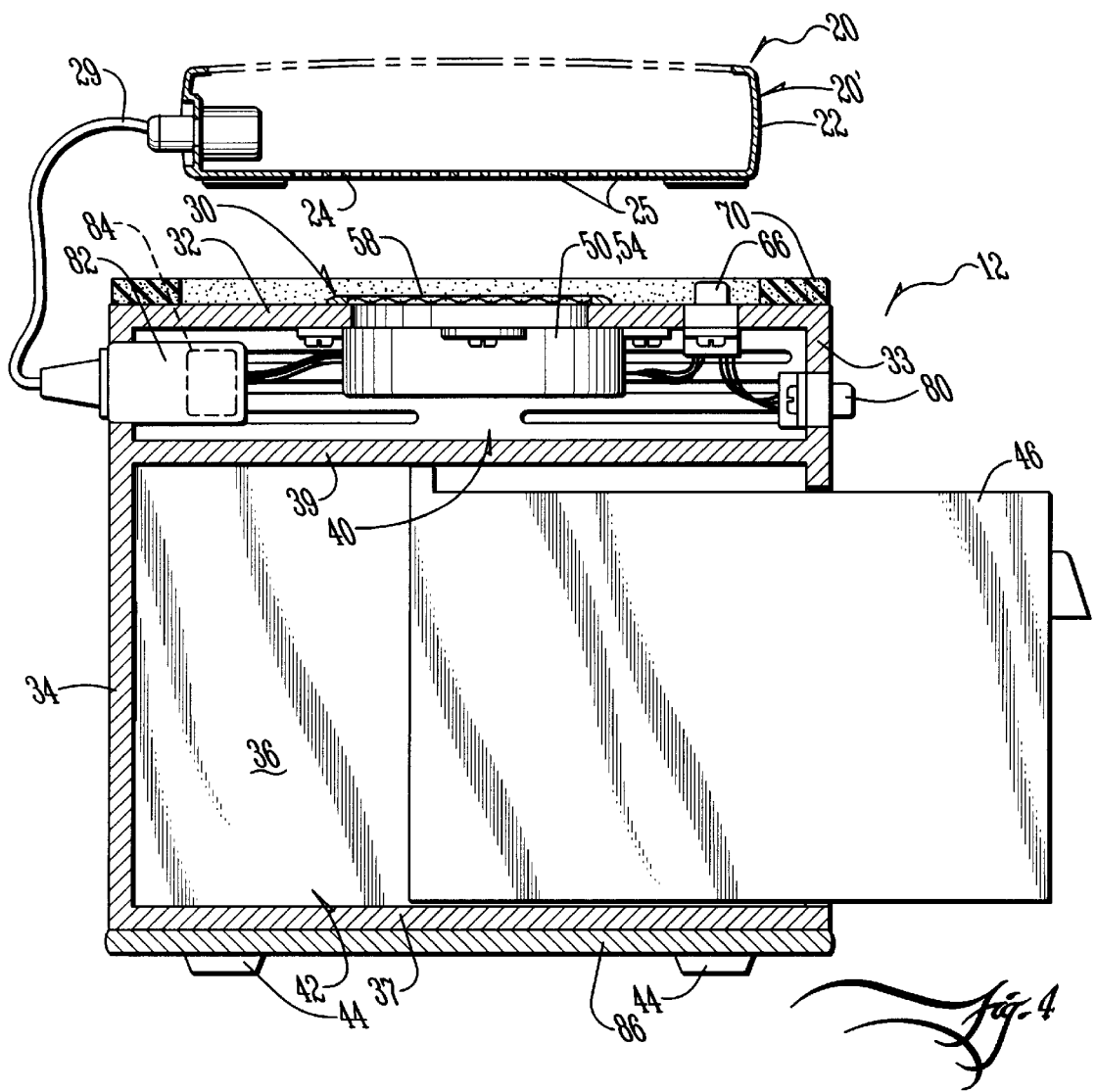
FIG. 4 is a comparable partial section view except showing an alternate embodiment of the ventilating base.

FIG. 4 is a comparable partial section view of FIG. 3 except showing an alternate version 12 of the ventilating base. This alternate version 12 includes several further inventive aspects as the following.

The alternate version 12 has a master ON/OFF switch 80 provided on its front panel 33. It has an auxiliary 120 VAC socket 82 provided on its back panel 34. The auxiliary 120 VAC socket 82 permits the line cord 29 of the SONY® Play-Station™ 20 to plug into the socket 82, as shown. That way, the master ON/OFF switch 80 controls the ON/OFF state of both the ventilating base 12 and SONY® Play-Station™ 20 simultaneously. Thus the master ON/OFF switch 80 helps eliminate times when the SONY® Play-Station™ 20 is switched ON but the ventilating base 12 remains OFF. (Regardless of those times, air is free to move through the upper compartment 40, as in through the slots 62 and up through the fan 50, without any real impedance. It's just that the air isn't positively motivated as when the fan 50 is OFF, and accordingly the ventilating base 12 works best when the fan 50 is ON.)

Also, the auxiliary socket 82 comprises a built-in surge protector 84 for providing protection to the given electronic apparatus 20 (eg., SONY® Play-Station™ against both small (eg., in-house) or large (eg., lightning) types of line surges. With attention to the bottom panel 37, it is supplemented with a weighted plate 86. This weighted plate 86 make the ventilating base 12 more bottom heavy and should also make the base 12 less susceptible to getting knocked over.

Further aspects of the invention concern the choice of components to produce the air motivating system 30 that is incorporated into the invention. There are available such off-the-shelf air fans as having low-noise motors, low noise fan blades, and motors which give off low EMI emissions (or else are suitably shielded or located remote from sensitive electronics in the given electronic apparatus 20). Such air motivation systems are commonly available for incorporation into laptop and desktop personal computers from a wide variety of commercial sources. Persons having ordinary skill are able to routinely choose the appropriate components for incorporation into the ventilating base 10,12 given the various use environments it will serve.

Accordingly, the ventilating base 10,12 in accordance with the invention provides a simple means of elevating a given electronic apparatus 20 up—as moderately out of harm's way—as well as service or augment service of waste-heat removal within such a given electronic apparatus 20. The ventilating base 10,12 can optionally be configured in a cabinet-like format, including a compartment 42 for storing or organizing accessories ordinarily attendant to the given electronic apparatus 20. One non-limiting example as shown by the drawings includes a drawer compartment 42 which when combined with a drawer 46, allows storage and filing organization of CD's (not shown) and the like for a SONY® Play-Station™ 20.

The ventilating base 10,12 can include a blower or impeller fan 50 and the like for expelling or suctioning air. The controls 64,66 can include variable speed and/or reverse. Further functions can include an auxiliary socket 82 for plug-in of the power cord 29 of the given electronic apparatus 20. That way the master power switch 80 of the ventilating base 12 becomes dominant. It eliminates a situation in which the given electronic apparatus 20 is switched ON but the ventilating base 12 is left OFF.

Figure 5:
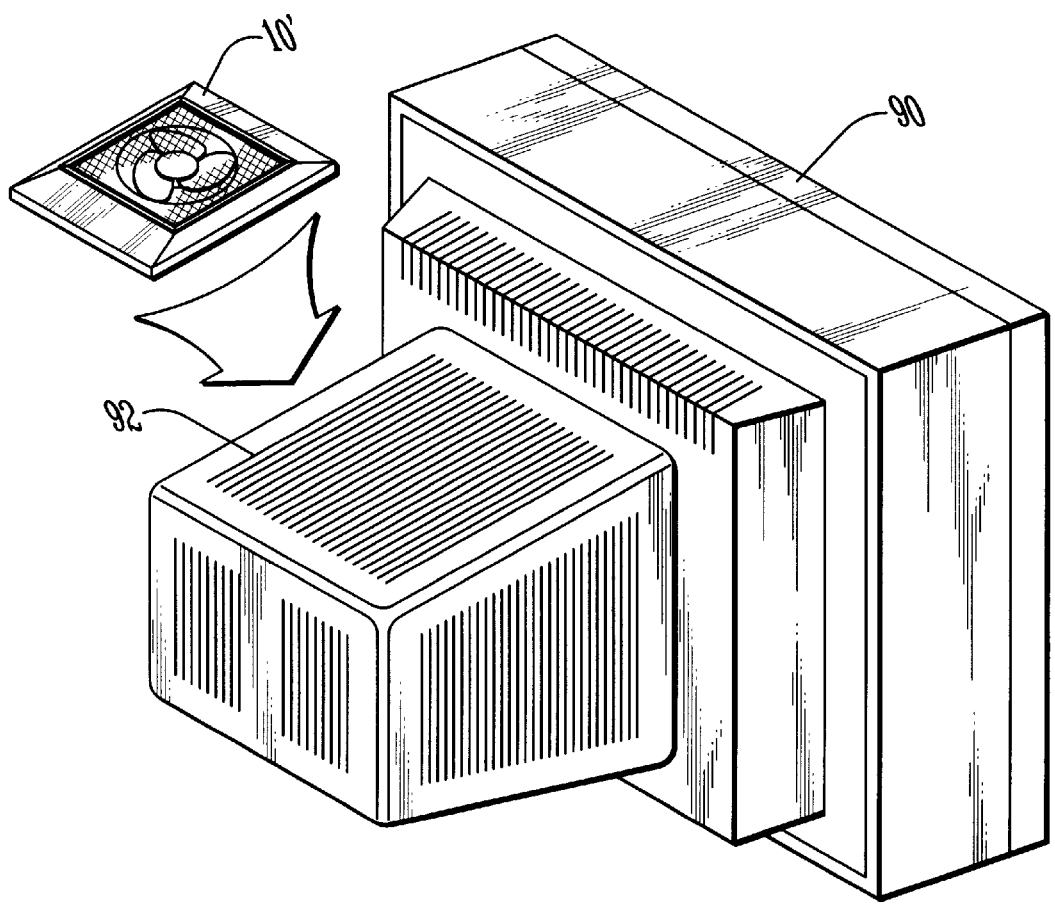
FIG. 5 is a perspective view of an alternate ventilating device in accordance with the invention, for setting on top of the ventilation grills of television's set sloping backside; and, FIG. 6 is a perspective view thereof in an alternate use environment, as setting on top of a satellite signal processor unit.

FIG. 5 shows an alternate embodiment 10' of a ventilating device in accordance with the invention. This ventilating device 10' is comparable to the previously described ventilating base 10 except it omits the drawer 46 and drawer compartment 42, and otherwise is arranged inverted with respect to the ventilating base 10 shown by the previous drawings. This ventilating device 10' is given the inverted arrangement as shown in FIG. 5 to allow use by setting the device 10' on top of the ventilation grill 92 in the sloping backside panel of a television set 90.

Figure 6:
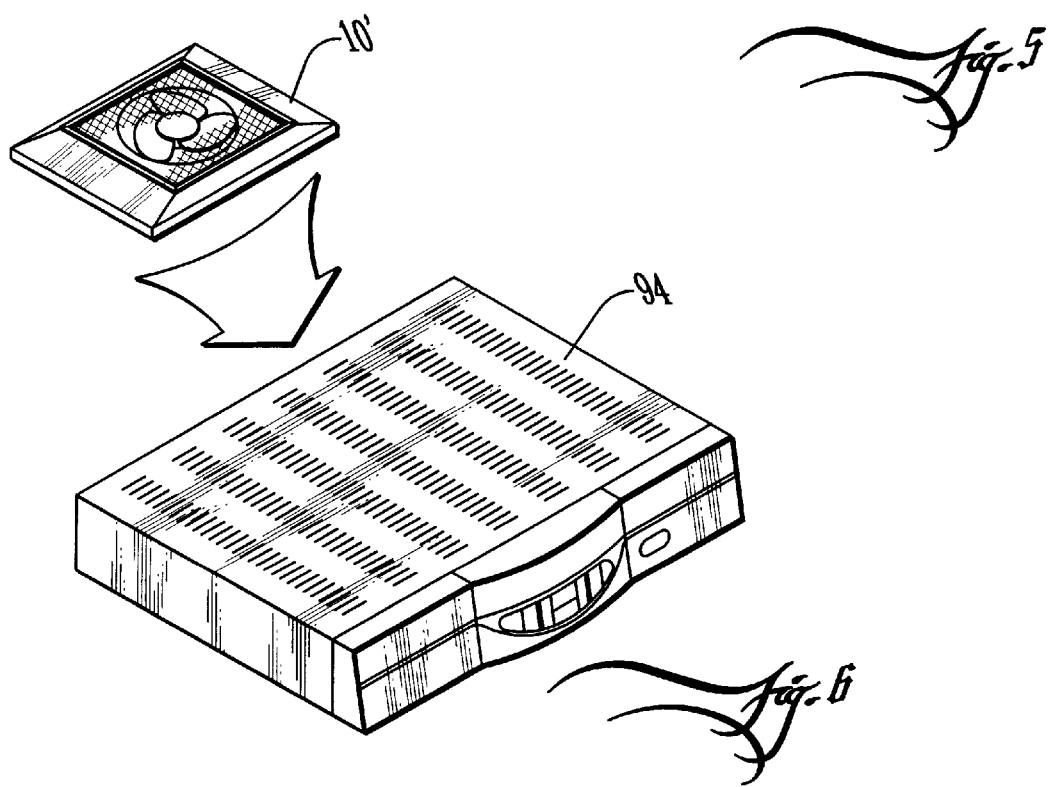

FIG. 6 shows an alternate utilization of the FIG. 5 ventilating base, as setting on top of a satellite signal processor unit 94.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

I claim:

1. A combination ventilating base and electronic device, comprising:

a given electronic unit chosen from one of a video game control unit, a satellite signal processor unit, a VCR unit, a CD player unit, a cassette tape player unit, and a stereo unit;

the given electronic unit having an enclosure formed of diverse panels including a ventilated bottom panel, wherein the bottom panel and at least another portion of said enclosure are formed with respective sets of ventilation openings that allow air currents to pass through the enclosure for removal of waste heat from the given electronic unit's enclosed electronics;

a ventilating base, having a frame construction including an apertured top wall;

an air blowing device mounted to the frame of the ventilating base and functionally connected with the apertured top wall to produce one of air suction, air blowing, or either at alternate times;

operative means for operating the air blowing device; and, docking means for docking the given electronic unit on the ventilating base and functionally coupling said ventilated bottom panel with said apertured top wall such that operation of the air blower induces a forced air current through the given electronic unit's enclosure by virtue of the functional coupling between the ventilating base's apertured top wall and the given electronic unit's ventilated bottom panel.

2. The combination of claim 1 wherein the air blowing device comprises an electric fan and the apertured top wall comprises a plate formed with a fan hole and having mounting means for mounting the fan with respect to the fan hole such that the fan operates to blow or suction air through such fan hole.

3. The combination of claim 2 wherein the electric fan is reversible and the operative means allows operating the fan reversibly in one or another of reversible modes.

4. The combination of claim 3 wherein the operative means includes speed control for varying the operating speed of the fan.

5. The combination of claim 3 wherein the operative means includes a socket for a line cord plug of the given electronic unit through which the given electronic unit draws an infeed of power, said operative means further including a master ON-OFF switch and socket power feed circuit such that switching said master switch OFF on said ventilating base concurrently opens the socket power feed circuit to the given electronic unit.

6. The combination of claim 1 wherein the frame construction of the ventilating base includes at least one and another compartments, wherein said air blowing device is housed in one compartment as the other compartment is utilized for storage space.

7. The combination of claim 6 wherein the other compartment is a drawer compartment, said ventilating base further including a drawer therefor.

8. The combination of claim 1 wherein the docking means includes a gasket loop affixed on the top wall for achieving the functional coupling between the ventilating base's apertured top wall and the given electronic unit's ventilated bottom panel, said gasket loop also providing a resilient seat for the bottom panel of the given electronic unit as well as a lightly sealing against some amount of air leakage.

9. The combination of claim 1 wherein, in cases when the given electronic unit comprises certain varieties of satellite signal processor units, said combination is arranged such that the certain satellite signal processor unit occupies the relatively lower position as the ventilating base is docked on top of said certain satellite signal processor unit and in an inverted position.

* * * * *